US008368113B2

(12) United States Patent
Matsuda et al.

(10) Patent No.: US 8,368,113 B2
(45) Date of Patent: Feb. 5, 2013

(54) LIGHT EMITTING DEVICE AND LIGHTING APPARATUS

(75) Inventors: Shuhei Matsuda, Yokosuka (JP); Erika Takenaka, Yokosuka (JP); Tomohiro Sanpei, Yokosuka (JP); Kazuto Morikawa, Yokosuka (JP); Masahiro Izumi, Yokosuka (JP); Kiyoshi Nishimura, Yokosuka (JP)

(73) Assignee: Toshiba Lighting & Technology Corporation, Kanagawa (JP)

(*) Notice: Subject to any disclaimer, the term of this patent is extended or adjusted under 35 U.S.C. 154(b) by 0 days.

(21) Appl. No.: 13/114,609

(22) Filed: May 24, 2011

(65) Prior Publication Data

US 2011/0291151 A1 Dec. 1, 2011

(30) Foreign Application Priority Data

May 26, 2010 (JP) ................................ 2010-120307

(51) Int. Cl.
*H01L 33/00* (2010.01)
(52) U.S. Cl. .......................................... 257/99; 257/706
(58) Field of Classification Search .................. 257/99, 257/706
See application file for complete search history.

(56) References Cited

U.S. PATENT DOCUMENTS

| 2008/0265271 A1 | 10/2008 | Biar |
| 2010/0277083 A1 | 11/2010 | Nishimura |
| 2011/0089462 A1* | 4/2011 | Van Heerden et al. ......... 257/99 |

FOREIGN PATENT DOCUMENTS

| JP | 2009-54989 | 3/2009 |
| JP | 2009-290244 | 12/2009 |
| JP | 2010-34487 | 2/2010 |
| WO | WO 2009/104645 | 8/2009 |

OTHER PUBLICATIONS

U.S. Appl. No. 12/973,992 electronically captured on Sep. 10, 2012.
English Abstract of JP 2009-54989 published Mar. 12, 2009.
English Translation of JP 2009-54989 published Mar. 12, 2009.
English Language Abstract of JP 2009-290244 published Dec. 10, 2009.
English Language Translation of JP 2009-290244 published Dec. 10, 2009.
English Language Abstract of JP 2010-34487 published Feb. 12, 2010.
English Language Translation of JP 2010-34487 published Feb. 12, 2010.
European Search Report issued in EP10195070 on Jul. 23, 2012.
Chinese Office Action issued in CN 201010608493.9 on Sep. 5, 2012.
English Language Translation of Chinese Office Action issued in CN 201010608493.9 on Sep. 5, 2012.

* cited by examiner

*Primary Examiner* — Douglas Menz
(74) *Attorney, Agent, or Firm* — DLA Piper LLP (US)

(57) ABSTRACT

According to one embodiment, a light emitting device includes a ceramics substrate, a metallic thermally-conductive layer formed on the substrate in which the substrate involves no electric connection, a light emitting element mounted on the metallic thermally-conductive layer, and a metallic bonding layer interposed between the metallic thermally-conductive layer and the light emitting element to bond the light emitting element to the metallic thermally-conductive layer.

2 Claims, 8 Drawing Sheets

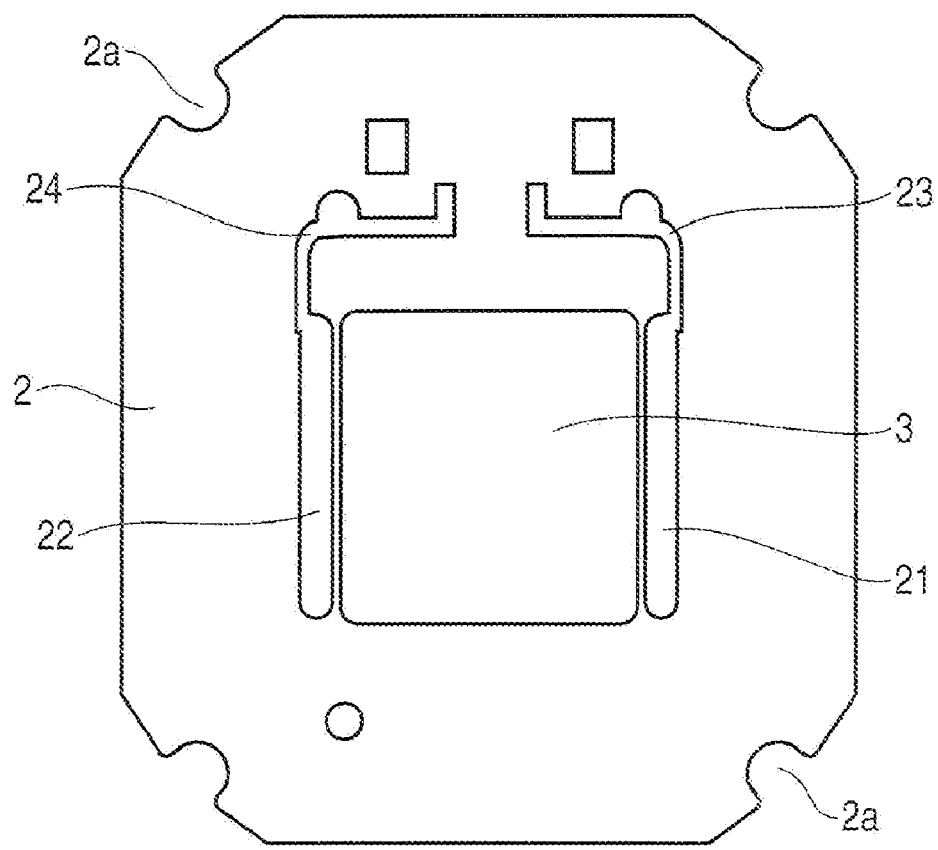
F I G. 2

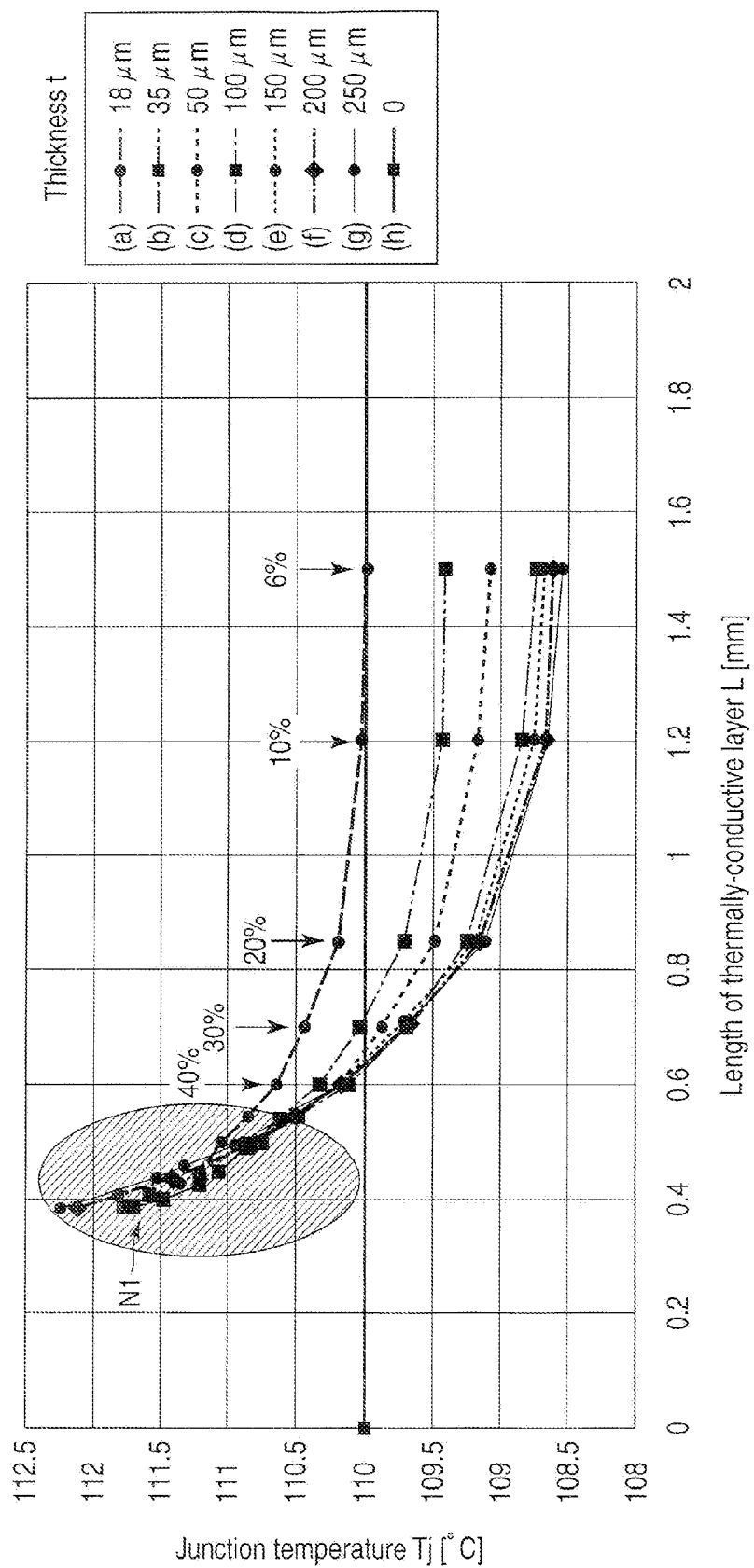
F I G. 7

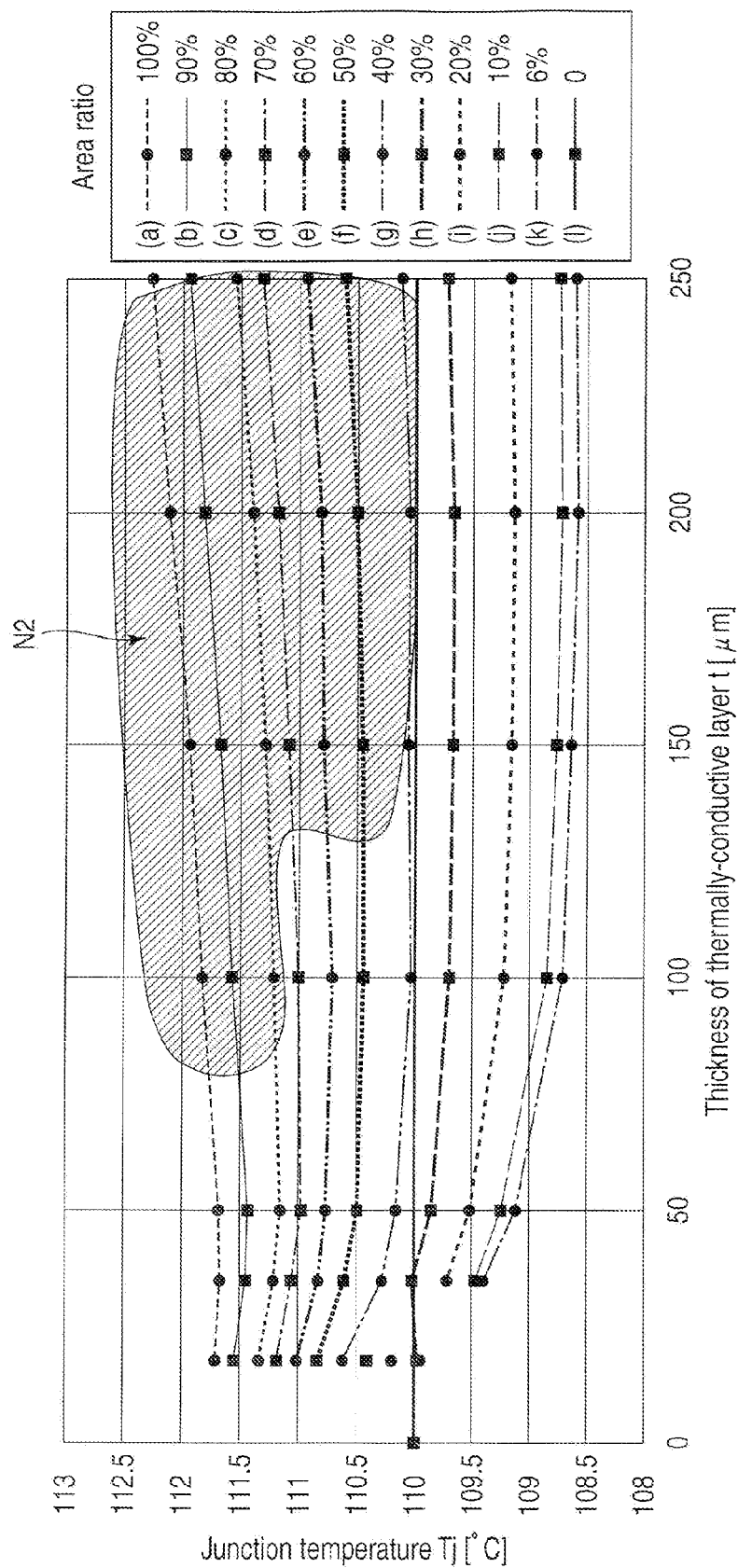
F I G. 8

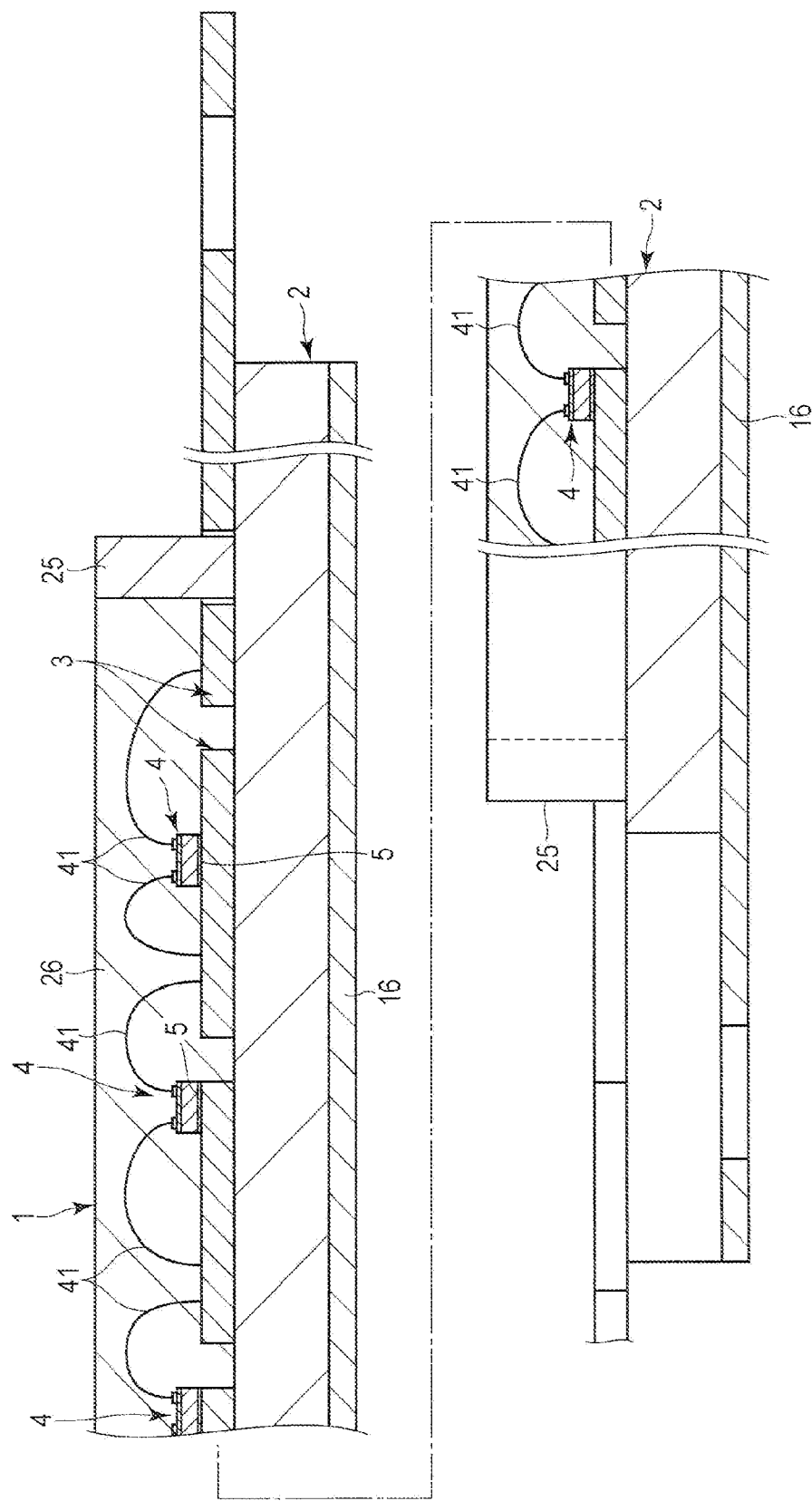
F I G. 9

LIGHT EMITTING DEVICE AND LIGHTING APPARATUS

CROSS-REFERENCE TO RELATED APPLICATIONS

This application is based upon and claims the benefit of priority from Japanese Patent Application No. 2010-120307, filed May 26, 2010; the entire contents of which are incorporated herein by reference.

FIELD

Embodiments described herein relate generally to a light emitting device and a lighting apparatus which use a light emitting element such as a light emitting diode (LED).

BACKGROUND

LEDs have recently been used as a light source for a lighting apparatus. This light source is configured into a lighting apparatus by mounting a large number of LED bare chips on a substrate and electrically connecting the LED chips with bonding wires.

In light emitting elements such as LEDs, a rise in the temperature of the element causes decrease in optical output and variation in characteristics and affects the life of the element. Thus, for light emitting devices using solid light emitting elements such as LEDs as a light source, a rise in the temperature of the element needs to be suppressed in order to improve the characteristics of the element such as the life and efficiency thereof.

As a substrate for light emitting devices, a ceramics substrate is conventionally known; the ceramics substrate has an insulation capability, is unlikely to be significantly thermally expanded, and is suited for applications requiring a heat radiation capability and heat resistance and involving supply of a high current as a driving current. Light emitting elements are mounted on the ceramics substrate by being bonded to the substrate with an adhesive of a resin material.

However, in the conventional light emitting device, since the light emitting elements are bonded to the substrate with the adhesive of the resin material, heat generated by the light emitting elements fails to be efficiently conducted to the substrate. This may prevent effective heat radiation. Furthermore, if light emitting elements are mounted on the substrate, the temperatures of: the light emitting elements may be non-uniform, thus varying optical output and emission colors among the individual light emitting elements.

BRIEF DESCRIPTION OF THE DRAWINGS

FIG. 2 is a plan view showing patterns of a thermally-conductive layer, a feed conductor of positive electrode, and a feed conductor of negative electrode on the substrate in the light emitting device according to the first embodiment;

FIG. 7 is a graph illustrating the relationship between the length of the thermally-conductive layer and the temperature of the light emitting element;

FIG. 8 is a similar graph illustrating the relationship between the thickness of the thermally-conductive layer and the temperature of the light emitting element;

FIG. 9 is a cross-sectional view showing a light emitting device according to a second embodiment.

DETAILED DESCRIPTION

Figure 1:
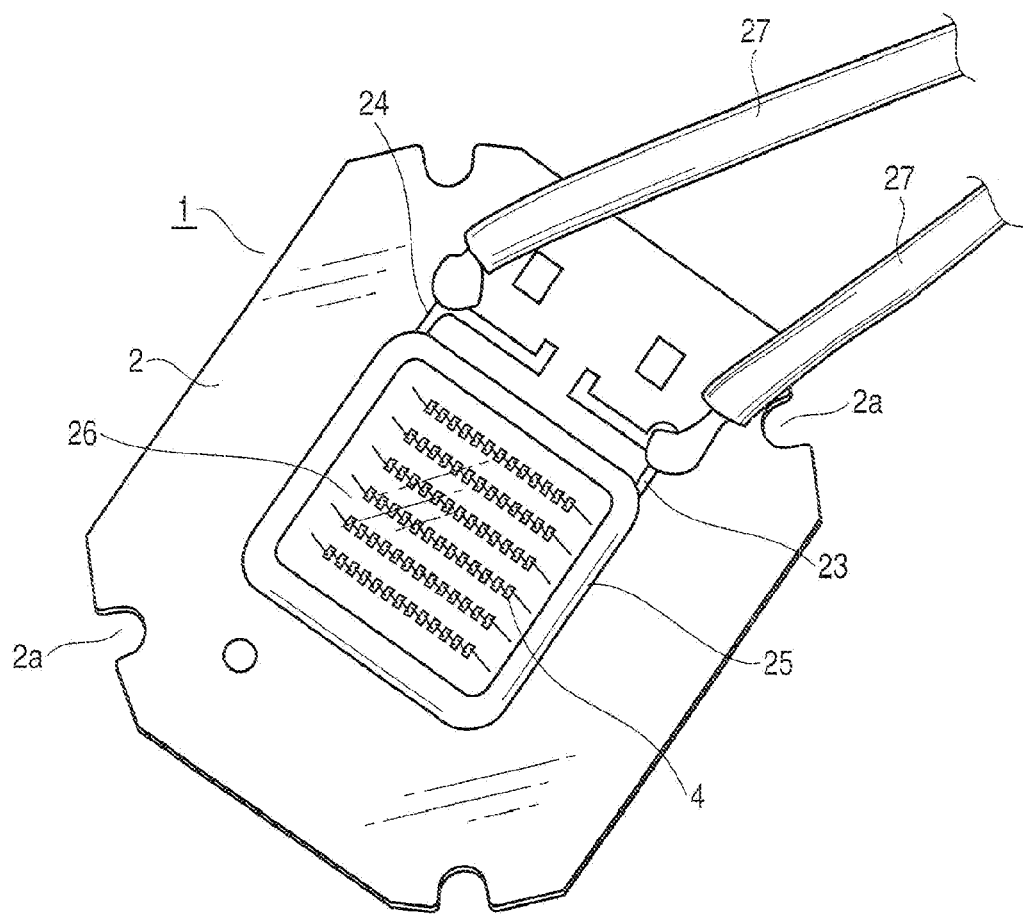
FIG. 1 is a perspective view showing a light emitting device according to a first embodiment.

Various embodiments will be described hereinafter with reference to the accompanying drawings.

In general, according to one embodiment, a light emitting device includes a ceramics substrate, a metallic thermally-conductive layer formed on the substrate in which the substrate involves no electric connection, a light emitting element mounted on the metallic thermally-conductive layer, and a metallic bonding layer interposed between the metallic thermally-conductive layer and the light emitting element to bond the light emitting element to the metallic thermally-conductive layer.

For the ceramics substrate, a ceramics material such as white aluminum oxide or aluminum nitride is applicable, but the material is not limited to a particular one.

The metallic thermally-conductive layer comprises, for example, a copper pattern as a first layer on the substrate, a nickel plated layer as a second layer on the first layer and a silver plated layer as a third layer on the second layer. The metallic thermally-conductive layer may be formed of one layer of the copper pattern. The material forming the metallic thermally-conductive layer is not particularly limited. Furthermore, the material forming the metallic bonding layer is also not limited to a particular one.

A solid light emitting element such as LED is applicable as the light emitting element. Moreover, the number of mounted light emitting elements is not particularly limited.

The light emitting device may be incorporated into the main body of a lighting apparatus for application. In this case, examples of the lighting apparatus include a light source, lighting equipment used indoor or outdoor, and a display apparatus.

(First Embodiment)

A light emitting device according to the present embodiment will be described with reference to FIGS. 1 to 8. In the figures, the same components are denoted by the same reference numerals, and duplicate descriptions are omitted.

As shown in FIGS. 1 to 4, a light emitting device 1 comprises a ceramics substrate, a metallic thermally-conductive layer 3 formed on the substrate, a light emitting element 4 mounted on the metallic thermally-conductive, layer, and a metallic bonding layer 5 interposed between the metallic thermally-conductive layer 3 and the light emitting element 4.

The substrate 2 has an insulation capability and is formed of a ceramics material such as white aluminum oxide or aluminum nitride. The substrate 2 has nearly a rectangular shape with cutout portions 2a formed in respective corners thereof, with which fixing means such as screws are engaged.

Figure 3:
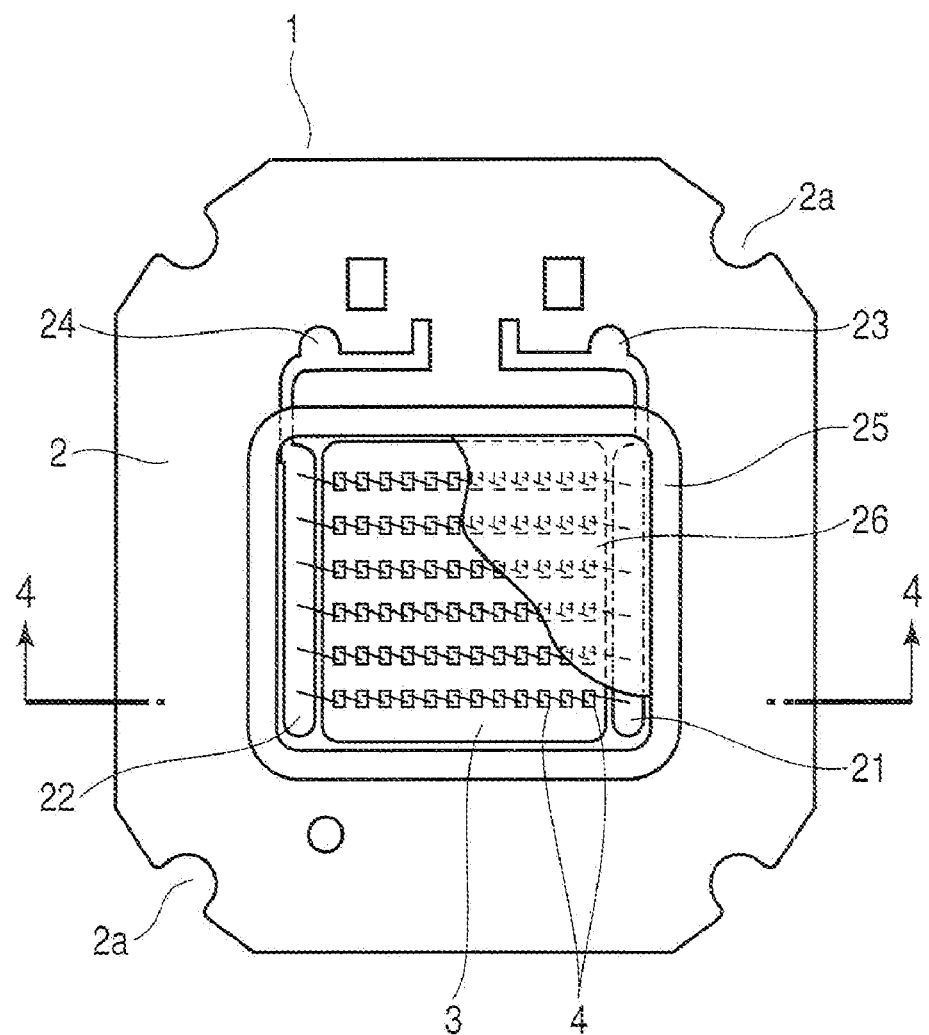
FIG. 3 is a partly cutout plan view showing the light emitting device according to the first embodiment.
Figure 4:
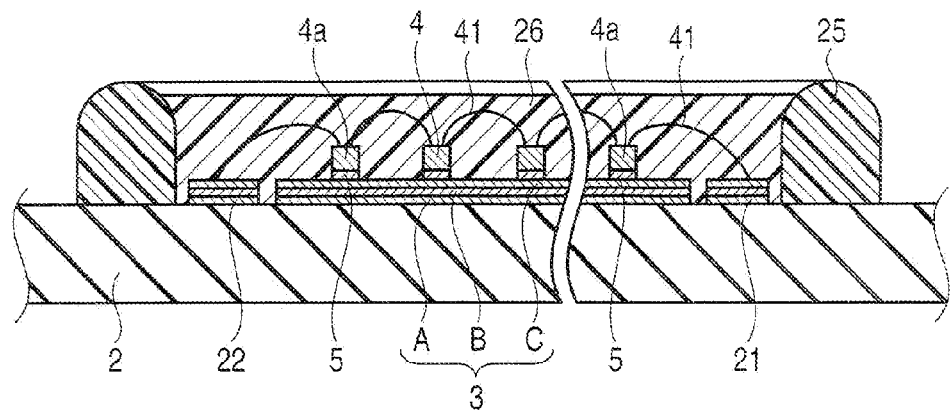
FIG. 4 is a cross-sectional view taken along the line X-X in FIG. 3.

As shown in FIGS. 2 to 4, the thermally-conductive layer, 3, a feed conductor of positive electrode 21, and a feed conductor of negative electrode 22 are stacked on a surface of the substrate 2 so as to have similar layer configurations. As shown in FIG. 2, the thermally-conductive layer 3 is formed on a central portion of the substrate 2 nearly a rectangular shape. The feed conductor of positive electrode 21 and the feed conductor of negative electrode 22 are formed parallel to corresponding sides of the thermally-conductive layer 3 and each located at a separation distance (insulation distance) from the thermally-conductive layer 3 so as to form a pair. Thus, the thermally-conductive layer 3 is in an unconnected state in which the thermally-conductive layer 3 has no electric connection, and thus does not act as an electrical conductor.

The feed conductor of positive electrode 21 and the feed conductor of negative electrode 22 are formed in a line symmetric manner and are each generally L-shaped. The feed conductor of positive electrode 21 and the feed conductor of negative electrode 22 are configured as feeding terminals 23 and 24, respectively, at one end thereof.

As shown in FIG. 4, the thermally-conductive layer 3, the feed conductor of positive electrode 21, and the feed conductor of negative electrode 22 each have a three-layered structure. A copper pattern is formed on the substrate as a first layer A by etching. The copper pattern layer is plated with nickel (Ni) as a second layer B by non-electrolytic plating. The second layer B is plated with silver (Ag) as a third layer C by non-electrolytic plating. The third layer C, that is, the front layer, of each, of the thermally-conductive layer 3, the feed conductor of positive electrode 21, and the feed conductor of negative electrode 22 is formed of silver (Ag) plated layer and has a high total ray reflectance of 90%. A resist layer may be appropriately formed on the surface of the substrate 2.

Light emitting elements 4 are mounted on the thermally-conductive layer 3 on the substrate 2. Each of the light emitting elements 4 comprises a LED bare chip. For example, the LED bare chip used emits blue light in order to allow a light emitting section to emit white light. The LED bare chips are bonded to the thermally-conductive layer 3 using a bonding agent comprising a metal material. Thus, a heat-conductive bonding layer 5 is formed between the thermally conductive layer 3 and the light emitting elements 4, that is, the LED bare chips.

Specifically, the bonding agent is Au—Sn alloy solder, and the Au—Su alloy solder layer forms the bonding layer. To form the bonding layer 5, first, Au—Sn alloy solder is applied to the thermally-conductive layer 3 at positions where the respective light emitting elements are to be disposed. Then, the light emitting elements 4 are arranged on the Au—Sn alloy solder. In this state, the substrate is heated, and a reflow process is carried out at a high temperature of about 300° C. to metal the Au—Sn alloy solder. The substrate is then cooled. Thus, the bonding layer 5 is formed, and the light emitting elements 4 are bonded onto the thermally-conductive layer 1. The bonding agent may be lead-free solder as solder of a metal material.

The light emitting elements 4 are arranged in a matrix so as to form a plurality of rows, for example, six rows of light emitting elements.

The LED bare chip is, for example, an InGaN-based element and comprises a translucent sapphire substrate and a light emitting layer stacked on the substrate. The light emitting layer includes an n-type nitride semiconductor layer, an InGaN light emitting layer, and a p-type nitride semiconductor layer which are sequentially stacked, and is patterned nearly into a rectangular parallelepiped shape. Electrodes configured to pass a current through the light emitting layer are provided on an upper surface side of the bare chip and comprise a plus electrode formed of a p-type electrode pad on the p-type nitride semiconductor layer and a minus electrode formed of an n-type electrode pad on the n-type nitride semiconductor layer. The electrodes are electrically connected by a bonding wire 41. The bonding wire 41 is formed of a thin gold (Au) wire and connected to the electrode via a bump formed mainly of gold (Au) in order to improve mounting strength and to reduce damage to the LED bare chip.

Specifically, in each of light emitting element rows, the electrodes of the different polarities on the light emitting elements 4 arranged adjacent to each other in the direction of extension of the row, that is, the plus electrode of one of the adjacent light emitting elements 4 and the minus electrode of the other light emitting element 4, are sequentially connected with the bonding wire 41. Thus, the light emitting elements 4 forming each light emitting element row are electrically connected in series. Hence, the light emitting elements 4 emit light concurrently when the device is energized.

Moreover, in each light emitting element row, the electrodes of particular light emitting elements, that is, the light emitting elements 4a arranged at the opposite ends of the row, are connected to the feed conductor of positive electrode 21 and the feed conductor of negative electrode 22, respectively, with the bonding wires 41. Thus, the light emitting element rows are electrically provided in parallel and supplied with electricity through the feed conductor of positive electrode 21 and the feed conductor of negative electrode 22. Thus, even if any one of the light emitting element rows fails to emit light as a result of inappropriate bonding or the like, not the whole light emitting device 1 fails to emit light.

A frame member 25 is provided on the surface of the substrate 2. The frame member 25 is obtained by coating an uncured silicone resin with a predetermined viscosity on the substrate 2 in the frame form using a dispenser and then heating and curing the silicone resin to be adhered to the surface of the substrate 2. The frame member 25 is applied in the frame form and has nearly a rectangular inner peripheral surface like the thermally-conductive layer 3. The whole thermally-conductive layer 3, the feed conductor of positive electrode 21 and the feed conductor of negative electrode 22, and the light emitting elements 4 are disposed inside the frame member 25, or in the area enclosed by the inner peripheral surface of the frame member 25. In other words, the area in with the light emitting elements 4 are mounted is surrounded by the frame member 25.

The frame member 25 is formed of the silicone resin as described above and is thus unlikely to be optically or thermally degraded. Thus, the thermally-conductive layer 3, feed conductor of positive electrode 21, and feed conductor of negative electrode 22, plated with silver (Ag) so as to form a front layer, can be restrained from changing colors. Hence, a decrease in the reflection efficiency of the thermally-conductive layer 3, feed conductor of positive electrode 21, and feed conductor of negative electrode 22 can be reduce.

An encapsulation member 26 is provided on the substrate 2 so as to be filled inside the frame member. The encapsulation member 26 is formed of a translucent synthetic resin, for example, a transparent silicone resin. The encapsulation member 26 encapsulates the thermally-conductive layer 3, the feed conductor of positive electrode 21 and the feed conductor of negative electrode 22, and the light emitting elements 4.

Furthermore, the encapsulation member 26 contains an appropriate amount of phosphor. The phosphor is excited by light emitted by the light emitting elements 4 to radiate light in a color different from that of light emitted by the light emitting elements 4. In the present embodiment, in which the light emitting elements 4 emit blue light, a yellow-emitting phosphor emitting yellow light that is complementary with the blue light is used to allow white light to be emitted. The encapsulation member 26 is formed by casting predetermined amount of material into the frame member 25 and then heating and curing the material.

As shown in FIG. 1, leads 27 are connected, by soldering, to the feeding terminal 23 located at one end of the feed conductor of positive electrode 21 and to the feeding terminal 24 located at one end of the feed conductor of negative electrode 22, respectively. A lighting circuit (not shown) is electrically connected to the leads 27 to supply power to the light emitting elements 4 to allow the light emitting elements 4 to be controllably lighted.

When the lighting circuit supplies power to the light emitting device 1 configured as described above, since the thermally-conductive layer 3 has no electric connection, a current is conducted from the feed conductor of positive electrode 21 to the bonding wire 41, the light emitting elements 41, and the feed conductor of negative electrode 22. Then, the light emitting elements 4, covered with the encapsulation member 26, concurrently emit light. The light emitting device 1 is thus used as a surface light source that emits white light.

During the lighting, the thermally-conductive layer 3 functions as a heat spreader that diffuses heat emitted by the light emitting elements 4. The heat emitted by the light emitting elements 4 is conducted from the bonding layer 5, formed of a very thermally-conductive metal material, that is, the Au—Sn alloy solder layer, to the thermally-conductive layer 3. The heat conducted to the thermally-conductive layer 3 is diffused and further conducted mostly to the substrate 2 for radiation.

Furthermore, during the lighting of the light emitting device 1, part of the light emitted by the light emitting elements 4 which travels toward the substrate 2 is reflected mostly in the direction of utilization of the light, by the front layers of, the thermally-conductive layer 3 feed conductor of positive electrode 21, and feed conductor of negative electrode 22.

As described above, the present embodiment can take advantage of the characteristics of the ceramics substrate 2 and improve the radiation of the heat generated by the heat emitting elements 4. Thus, rise in the temperature of the light emitting elements 4 can be suppressed. Furthermore, the temperatures of the light emitting elements 4 can be made uniform, reducing a variation in optical output and emission colors among the individual light emitting elements.

In addition, if the bonding layer 5 is formed at high temperature, possible thermal damage to the substrate 2 can be avoided because the substrate is heat resistant.

Based on the above-described embodiment, the present inventors examined the relationship between the area of the thermally-conductive layer 3 and the temperature of the light emitting elements 4 as shown in FIGS. 5 to 8. Specifically, the present inventors examined the relationship between the area ratio R of the junction area Ls of the light emitting element 4 to the area Ms of the thermally-conductive layer 3 and junction temperature Tj measured during the lighting of the light emitting elements 4.

Figure 5:
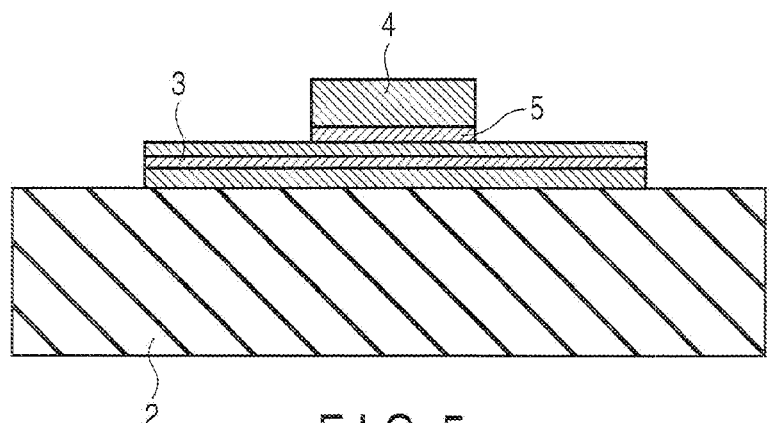
FIG. 5 is a cross-sectional view schematically showing a sample used to examine the relationship between the area of the thermally-conductive layer and the temperature of a light emitting device according to the first embodiment.
Figure 6:
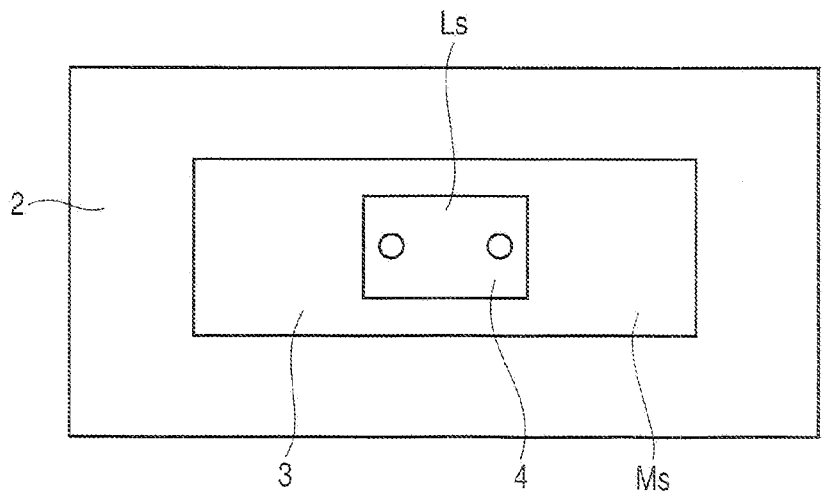
FIG. 6 is a plan view of FIG. 5.

As shown in FIG. 5 and FIG. 6, the substrate 2 with one light emitting element 4 mounted thereof was prepared as a sample. The area Ms of the thermally-conductive layer 3 corresponds to one light emitting element 4. When a plurality of light emitting elements 4 are mounted on the thermally-conductive layer 3, the area Ms of the thermally-conductive layer 3 per light emitting element 4 can be obtained by dividing the total area of the thermally-conductive layer 3 by the number of the light emitting elements 4. The junction area Ls of the light emitting element 4 is the junction area between one light emitting element 4 and the thermally-conductive layer 3. This junction area Ls is approximate to the light emission area on the upper surface of the light emitting element 4. It should be noted that when the area of the bonding layer 5 is smaller than that of the light emitting element 4, the junction area Ls per light emitting element 4 means the area of the bonding layer 5 in a precise sense. Various such samples were prepared in which the thermally-conductive layer 3 varied in area Ms and thickness dimension t to measure the junction temperature Tj.

As a result, such data as shown in FIGS. 7 and 8 were obtained. First, in FIG. 7, the vertical axis indicates the junction temperature Tj [° C.], and the horizontal axis indicates the length dimension L [mm] of the thermally-conductive layer 3. The length dimension L of the thermally-conductive layer 3 has correlation with the area Ms of the thermally-conductive layer 3 and can be replaced, with the area Ms. Thus, the indications of 6% to 40% correspond to the area ratio R of the junction area Ls of the light emitting element 4 to the area Ms of the thermally-conductive layer 3.

For several types of samples ((a) to (k); see FIG. 8) with an area ratio R of 6% to 100%, the junction temperature Tj [° C.] was measured with the thickness dimension t varied between 18 μm and 250 μm ((a) to (g); see FIG. 7). As a result, as shown in FIG. 7, the junction temperature [° C.] tends to decrease consistently with decreasing the area ratio R and with increasing thickness dimension t. The line (h) indicates the junction temperature Tj [° C.] measured when the thermally-conductive layer 3 was not formed ("no thermally-conductive layer") and the light emitting element 4 was provided directly on the substrate 2. In this case, the line (h) corresponds to 110° C. Hence, based on this, in an area above 110° C., formation of the thermally-conductive layer 3 does not serve to exert any heat radiation effect. In an area below 110° C., formation of the thermally-conductive layer 3 serves to exert a heat radiation effect. Incidentally, samples having an area ratio of 5% represent a junction temperature Tj lower than 110° C. within entire range of between 18 μm and 250 μm of the thickness dimension t of the thermally-conductive layer 3.

In an area where the formation of the thermally-conductive layer 3 does not serve to exert a radiation effect, for example, in an area N1, it is conceivable that a high area ratio R prevents heat from being effectively diffused and that the thermally-conductive layer 3 acts as heat resistance, thus hindering thermal conduction to the substrate 2.

Thus, the data in FIG. 7 indicates that an, area ratio R of at least 5% allows the junction temperature Tj to be set equivalent to or lower than that corresponding to the curve (h) with "no thermally-conductive layer 3", depending on the status of combination with the thickness t. This allows a rise in the temperature of the light emitting element 4 to be effectively suppressed.

FIG. 8 indicates measurement data with different coordinate axes. That is, the vertical axis indicates the junction temperature Tj [° C.], and the horizontal axis indicates the thickness dimension t [μm] of the thermally-conductive layer 3.

Like FIG. 7, FIG. 8 shows that the junction temperature. Tj [° C.] tends to decrease consistently with decreasing the area ratio R and with increasing thickness dimension t. As described above, based on the line (l), in an area above 110° C., formation of the thermally-conductive layer 3 does not serve to exert any heat radiation effect. In an area below 110° C., formation of the thermally-conductive layer 3, serves to exert a heat radiation effect.

However, as shown in FIG. 8, in an area N2 where formation of the thermally-conductive layer 3 does not serve to exert any heat radiation effect, the junction temperature Tj [° C.] tends to increase in spite of an increase in thickness: dimension t. This is expected to be due town increase in the degree to which the thermally-conductive layer 3 acts as heat resistance in connection with the area ratio R as a result of an increase in the thickness dimension t of the thermally-conductive layer 3.

The data shown in FIG. 8 as described above indicates that an area ratio R of 40% or less allows the junction temperature Tj to be set equivalent to or lower than that corresponding to the line (l) with "no thermally-conductive layer 3", depending on the status of combination with the thickness t. This allows a rise in the temperature of the light emitting element 4 to be effectively suppressed.

As described above, the heat radiation effect can be improved by setting the ratio of the junction area Ls between the thermally-conductive layer 3 and one light emitting element to the area Ms of the thermally-conductive layer 3 per light emitting element 4 to 5% or more and 40% or less.

(Second Embodiment)

A light emitting device 1 using a DCB (direct copper bonding) substrate will be described with reference to FIG. 9. The DCB substrate comprises a ceramics substrate 2 with a copper layer 16 of thickness about 50 μm formed on a back surface thereof. A front surface side of the ceramics substrate is similar, in structure, to that shown in, for example, FIG. 4. FIG. 9 shows that the thermally-conductive layer 3 comprises one metal layer. When the DCB substrate is used, the thermally-conductive layer 3 on the front surface may be made 250 μm or more in thickness.

(Third Embodiment)

A light emitting device 1 can be configured into a lighting apparatus by being incorporated into a light source serving as a LED lamp or lighting equipment used indoors or outdoors or into the apparatus main body of a display apparatus or the like.

Figure 10:
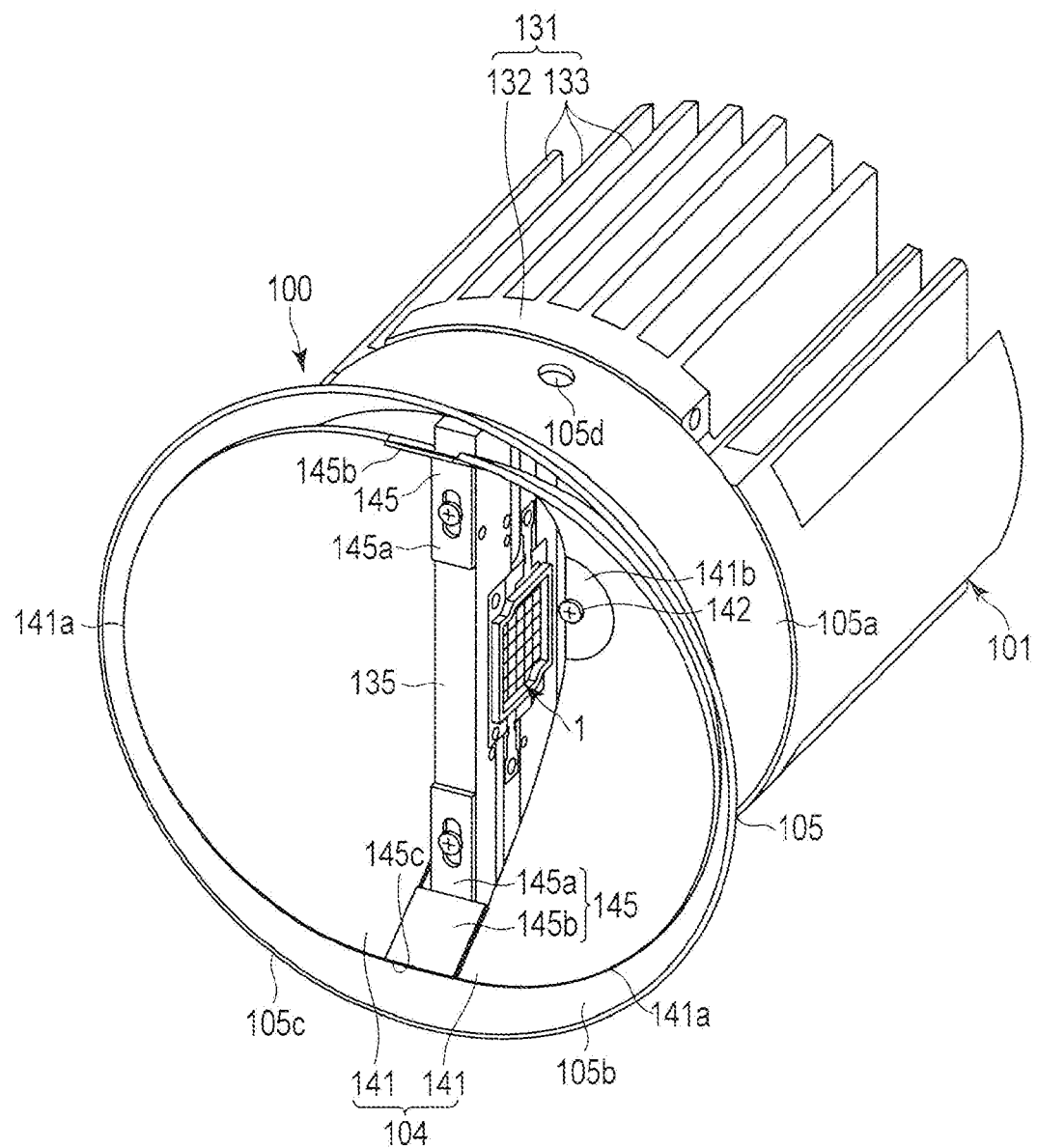
FIG. 10 is a perspective view showing a lighting apparatus according to a third embodiment.

A lighting apparatus according to the present embodiment will be described with reference to FIG. 10. The lighting apparatus 100 includes two light emitting devices 1, a main body 103, a concave reflecting mirror 104, and a mirror support member 105. The light emitting device 1 may be the one described in the first or second embodiment.

The main body 103 comprises a heat sink 131 forming a case and a heat receiving section 135. The heat sink 31 includes a plurality of integrated radiation fins 133 attached perpendicularly to a rear surface of a generally circular base 132. The heat receiving section 135 is a rectangular parallelepiped with a thickness equivalent to that of the base 132. The heat receiving section 135 is separate from the heat sink 131 and is attached to a front surface of the main body 103 which is located opposite the base 132.

The concave reflecting mirror 104 comprises paired concave mirror members 141 formed of aluminum. A reflecting surface of each of the concave mirror members 141 is formed to be paraboloidal and has a mirror surface finish. The concave mirror member 141 includes a semicircular arc edge 141a positioned on a light exit side and a seat portion 141b positioned on the base 132 side. The seat portion 141b is formed to be flat along the base 132 and includes a cutout 141c. The concave mirror member 141 is fixed to the base 132 by bringing the seat portion 141b into contact with a front surface of the base 132 of the heat sink 131a and using a screw 142 installed in a fixation hole in the base 132 so as to engage with the cutout 141c.

The paired concave mirror members 141 fixed to the front surface side of the heat sink 131 face the light emitting device 1 on the opposite sides, of the heat receiving section 135. The paired concave mirror members are arranged plane symmetrically with respect to the heat receiving section 135. An encapsulation member containing a phosphor and serving as a light emitting section of the light emitting device 1 is located opposite the reflecting surface formed by the paraboloidal surface of the concave mirror member 141. The light emitting device 1 is arranged such that a central portion of the light emitting section is positioned at the focus of the concave mirror member 141.

Mirror holders 145 are fixed, by screws from the front surface side, to respective ends of the heat receiving section 135 which is located away from the center of a luminous flux radiated by the lighting apparatus 100 in a radial direction. Each of the mirror holders 145 includes a mounting piece portion 145a that is in abutting contact with the heat receiving section 135 and a covering piece portion 145b folded along the reflecting surface; the mounting piece portion 145a and the covering piece portion 145b are integrated together. The reflecting surfaces of the paired concave mirror members 141 are spaced from each other by a distance corresponding to the heat receiving section 135 interposed between the paired concave mirror members 141. When the mounting piece portion 145a is screwed to the heat receiving section 135, the covering piece portion 145b is placed so as to cover the gap between the concave mirror members 141. Thus, edges 141a of the concave mirror members 141 and leading edges 145c of the covering piece portions 145b form a shape approximate to a circle.

A mirror support member 105 also serving as a cover for the concave reflecting mirror 104 comprises a cylindrical base portion 105a and a brace portion 105b broadening from one end of the base portion 105a like a trumpet. The brace portion 10b is tapered and is larger than the base portion 105a in diameter. The brace portion 105b appears circular as seen from the front surface side. The mirror support member 105 is held between the base 132 and a peripheral portion of the concave reflecting mirror 104 by bringing the base portion 105a into abutting contact with the front surface of the base 132 and bringing the brace portion 105b into contact with the back surface of an outer peripheral portion of the concave reflecting mirror 104. The mirror support member 105 supports the concave reflecting mirror 104 from the back side.

The mirror support member 105 is pre-placed in front of the base 132 and then held by the concave mirror member 141 fixed to the base 132. An opening edge 105c formed on the brace portion 105b of the mirror support member 105 is positioned in front of the edge 141a of the concave mirror member 141 and the leading edges 145c of the mirror holders 145, that is, the opening edge 105c is positioned on the light exit side. The concave reflecting mirror 104 and the mirror holders 145 are housed in the mirror support member 105. A cable hole 105d is provided so that an insulating coated electric wire to be connected to a feeding terminal can be passed through the cable hole 105d.

The lighting apparatus provided can exert the effects of the above-described light emitting device.

In the description of the above-described embodiment, the thermally-conductive layer is formed of throe layers of copper, nickel, and silver. However, the thermally-conductive layer is not limited to this configuration and may be formed of, for example, one layer of a copper foil. Moreover, the material forming the thermally-conductive layer is not limited to particular one. Furthermore, the metal material forming the bonding layer is not limited to particular one.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such, forms or modifications as would fall within the scope and spirit of the inventions.

What is claimed is:

1. A light emitting device comprising:
    a ceramics substrate;
    a metallic thermally-conductive layer formed on the substrate in which the substrate involves no electric connection;
    a light emitting element mounted on the metallic thermally-conductive layer;
    a metallic bonding layer interposed between the metallic thermally-conductive layer and the light emitting element to bond the light emitting element to the metallic thermally-conductive layer, and
    wherein a ratio of a junction area between the metallic thermally-conductive layer and one light emitting element to an area of the thermally-conductive layer per light emitting element ranges between 5% or more and 40% or less.

2. A lighting apparatus comprising:
    a lighting apparatus main body; and
    the light emitting device according to claim 1 mounted on the lighting apparatus main body.

* * * * *